United States Patent
Welch et al.

(10) Patent No.: US 10,942,211 B2
(45) Date of Patent: Mar. 9, 2021

(54) ELECTRICAL EQUIPMENT DIAGNOSTIC SYSTEMS

(71) Applicant: Bowtie Engineering, Cumming, GA (US)

(72) Inventors: John Welch, Cumming, GA (US); Cason Rogers, Katy, TX (US)

(73) Assignee: Bowtie Engineering, Cumming, GA (US)

( * ) Notice: Subject to any disclaimer, the term of this patent is extended or adjusted under 35 U.S.C. 154(b) by 301 days.

(21) Appl. No.: 15/949,361

(22) Filed: Apr. 10, 2018

(65) Prior Publication Data

US 2019/0310305 A1    Oct. 10, 2019

(51) Int. Cl.
*G01R 31/12* (2020.01)
*G01N 21/88* (2006.01)
*G06F 16/25* (2019.01)

(52) U.S. Cl.
CPC ..... *G01R 31/1218* (2013.01); *G01N 21/8806* (2013.01); *G01R 31/1272* (2013.01); *G06F 16/252* (2019.01)

(58) Field of Classification Search
CPC ............ G01R 31/1218; G01R 31/1272; G01N 21/8806; G06F 16/252; G06F 16/5838
See application file for complete search history.

(56) References Cited

U.S. PATENT DOCUMENTS

| 10,239,612 B1* | 3/2019 | Whitten | G06Q 10/10 |
| 2009/0109021 A1* | 4/2009 | Paoletti | G01R 31/343 |
| | | | 340/540 |
| 2017/0054923 A1* | 2/2017 | Thompson | G01R 31/62 |

* cited by examiner

*Primary Examiner* — Bryan Bui

(74) *Attorney, Agent, or Firm* — King & Spalding LLP

(57) ABSTRACT

An electrical equipment diagnostic system can include an electrical equipment and a sensor device controlled by a user that takes a first measurement of a first parameter of the electrical equipment while the electrical equipment is operating. The system can also include a controller communicably coupled to the sensor device, where the controller includes a storage repository, where the storage repository includes at least one threshold value and at least one algorithm. The controller can receive the first measurement from the sensor device, and process the at least one first algorithm using the first measurement. The controller can also identify a problem with the electrical equipment based on results of the at least one first algorithm, and instruct the user to perform specific tasks to correct the problem with the electrical equipment.

16 Claims, 4 Drawing Sheets

ELECTRICAL EQUIPMENT DIAGNOSTIC SYSTEMS

TECHNICAL FIELD

Embodiments described herein relate generally to electrical systems, and more particularly to systems, methods, and devices for diagnosing electrical equipment.

BACKGROUND

Electrical systems are made up of a number of pieces of electrical equipment. The electrical equipment is periodically subject to failure, and recognizing when such electrical equipment is about to fail or is degrading is difficult to determine. Preventative maintenance programs, predictive maintenance programs, and scheduled maintenance programs are sometimes used, but these programs require the electrical equipment to be out of service. While the duration of outages can vary, they are usually short, and so many of these programs cannot be practiced on a consistent basis.

SUMMARY

In general, in one aspect, the disclosure relates to an electrical equipment diagnostic system. The system can include an electrical equipment. The system can also include a first sensor device controlled by a user that takes a first measurement of a first parameter of the electrical equipment while the electrical equipment is operating. The system can further include a controller communicably coupled to the first sensor device, where the controller includes a storage repository, where the storage repository includes at least one threshold value and at least one first algorithm. The controller of the system can receive the first measurement from the first sensor device. The controller of the system can also process the at least one first algorithm using the first measurement. The controller of the system can further identify a problem with the electrical equipment based on results of the at least one first algorithm. The controller of the system can also instruct the user to perform specific tasks to correct the problem with the electrical equipment.

In another aspect, the disclosure can generally relate to a method for diagnosing electrical equipment within a system. The method can include receiving, at a diagnostic module, a first measurement from a first sensor device, where the first measurement measures a first parameter associated with the electrical equipment while the electrical equipment is in service. The method can also include evaluating, by the diagnostic module, the first measurement. The method can further include determining, based on the diagnostic module evaluating the first measurement, that there is a problem with the electrical equipment. The method can also include identifying, by the diagnostic module, the problem with the electrical equipment. The method can further include determining, by the diagnostic module, specific steps to solve the problem with the electrical equipment. The method can also include sending, from the diagnostic module, the specific steps to a user to resolve the problem.

In yet another aspect, the disclosure can generally relate to a controller of an electrical equipment diagnostic system. The controller can include a control engine configured to receive a first measurement of electrical equipment from a sensor device, where the first measurement is taken while the electrical equipment is in service. The controller can also include a diagnostic module communicably coupled to the control engine. The diagnostic module can process at least one algorithm using the first measurement. The diagnostic module can also identify a problem with the electrical equipment based on results of the at least one algorithm. The diagnostic module can further generate instructions to perform specific tasks to correct the problem with the electrical equipment. The control engine can provide the instructions to a user.

These and other aspects, objects, features, and embodiments will be apparent from the following description and the appended claims.

BRIEF DESCRIPTION OF THE DRAWINGS

The drawings illustrate only example embodiments of electrical equipment diagnostic systems and are therefore not to be considered limiting of its scope, as electrical equipment diagnostic systems may admit to other equally effective embodiments. The elements and features shown in the drawings are not necessarily to scale, emphasis instead being placed upon clearly illustrating the principles of the example embodiments. Additionally, certain dimensions or positions may be exaggerated to help visually convey such principles. In the drawings, reference numerals designate like or corresponding, but not necessarily identical, elements.

DETAILED DESCRIPTION OF EXAMPLE EMBODIMENTS

Figure 1:
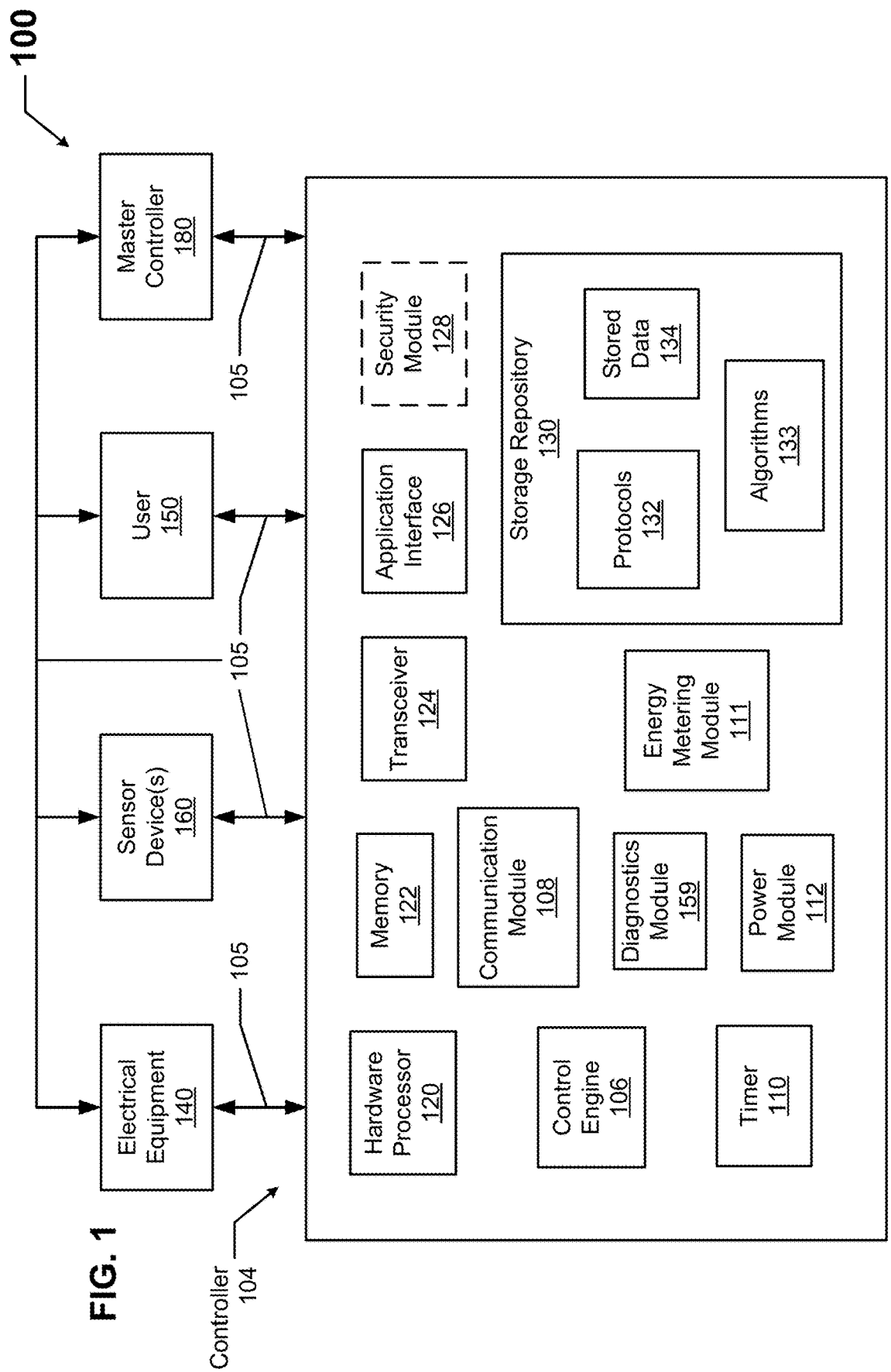
FIG. 1 shows a diagram of an electrical equipment diagnostic system in accordance with certain example embodiments.

The example embodiments discussed herein are directed to systems, apparatuses, and methods of diagnosing electrical equipment. While example embodiments described herein are directed to electrical equipment, example embodiments can also be used with electro-mechanical devices, electronic devices, and/or mechanical devices. Therefore, example embodiments can be used with any type of device, not strictly electrical devices.

The electrical equipment diagnosed by example systems (or components thereof) described herein can be physically placed in any of a number of indoor and/or outdoor environments. In addition, or in the alternative, electrical equipment (or components thereof) diagnosed by example systems can be subject to extreme heat, extreme cold, moisture, humidity, chemical exposure (related to potential combustion for chemical corrosion), high winds, dust, hazardous conditions, and other conditions that can cause wear on the electrical equipment or portions thereof. In certain example embodiments, the electrical equipment diagnosed by example systems, including any components and/or portions thereof, are made of materials that are designed to maintain a long-term useful life and to perform when required without mechanical failure.

In the foregoing figures showing example embodiments of electrical equipment diagnostic systems, one or more of the components shown may be omitted, repeated, added, and/or substituted. Accordingly, example embodiments of electrical equipment diagnostic systems should not be considered limited to the specific arrangements of components shown in any of the figures. For example, features shown in one or more figures or described with respect to one embodiment can be applied to another embodiment associated with a different figure or description.

Further, if a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three digit number and corresponding components in other figures have the identical last two digits.

In addition, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein.

In some cases, example embodiments can be used to comply with certain standards and/or requirements. Examples of entities that set and/or maintain standards include, but are not limited to, the Department of Energy (DOE), the National Electric Code (NEC), the National Electrical Manufacturers Association (NEMA), the International Electrotechnical Commission (IEC), the American Society of Mechanical Engineers (ASME), the National Fire Protection Association (NFPA), Underwriters' Laboratories (UL), and the Institute of Electrical and Electronics Engineers (IEEE). Use of example embodiments described herein can ensure compliance with and/or prevent an accident that violates such standards.

Example embodiments of electrical equipment diagnostic systems will be described more fully hereinafter with reference to the accompanying drawings, in which example embodiments of electrical equipment diagnostic systems are shown. Electrical equipment diagnostic systems may, however, be embodied in many different forms and should not be construed as limited to the example embodiments set forth herein. Rather, these example embodiments are provided so that this disclosure will be thorough and complete, and will fully convey the scope of electrical equipment diagnostic systems to those of ordinary skill in the art. Like, but not necessarily the same, elements (also sometimes called components) in the various figures are denoted by like reference numerals for consistency.

Terms such as "first", "second", "top", "bottom", "front", "rear", "side", "end", "left", "right", "outer", "outward", and "within" are used merely to distinguish one component (or part of a component or state of a component) from another. Such terms are not meant to denote a preference or a particular orientation, and are not meant to limit embodiments of electrical equipment diagnostic systems. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIG. 1 shows a system diagram of an electrical equipment diagnostic system 100 in accordance with certain example embodiments. The system 100 of FIG. 1 can include one or more components. For example, in this case, the system 100 includes one or more components or pieces of electrical equipment 140, one or more sensor devices 160, a controller 110, at least one user 150, and an optional master controller 180.

The controller 104 can include one or more of a number of components. Such components, can include, but are not limited to, a control engine 106, a communication module 108, a timer 110, an energy metering module 111, a diagnostics module 159, a power module 112, a storage repository 130, a hardware processor 120, a memory 122, a transceiver 124, an application interface 126, and, optionally, a security module 128. The components shown in FIG. 1 are not exhaustive, and in some embodiments, one or more of the components shown in FIG. 1 may not be included in an example diagnostic system. Any component of the example controller 104 can be discrete or combined with one or more other components of the controller 104.

A user 150 can be any person that interacts with example electrical equipment diagnostic systems. Examples of a user may include, but are not limited to, a consumer, an electrician, an engineer, a mechanic, a pipe fitter, an instrumentation and control technician, a consultant, a contractor, an operator, an equipment distributer/reseller, and a manufacturer's representative. The user 150 can use a user system (not shown), which may include a display (e.g., a GUI). The user 150 can interact with (e.g., send data to, receive data from) the controller 104 via the application interface 126 (described below). The user 150 can also interact with the master controller 180, the sensor device 160, and/or the electrical equipment 140 in the system 100. For example, the sensor device 160 can have a system and an interface that can be used by the user to communicate with the controller 104.

Interaction between the user 150, the controller 104, a sensor device 160, an electrical equipment 140, and/or the master controller 180 is conducted using communication links 105. Each communication link 105 can include wired (e.g., Class 1 electrical cables, Class 2 electrical cables, electrical connectors, power line carrier, DALI, RS485) and/or wireless (e.g., Wi-Fi, visible light communication, cellular networking, UART, SPI, I2C, visible light communication (VLC), 802.15.4 wireless, ZigBee, 4G cellular wireless, Bluetooth, WirelessHART, ISA100) technology. A communication link 105 can transmit signals (e.g., power signals, communication signals, control signals, data) between the controller 104, an electrical equipment 140, a sensor device 160, the user 150, and/or the master controller 180.

The master controller 180 is a device or component that controls all or a portion of a communication network that includes the controller 104. The master controller 180 can be substantially similar to the controller 104. Alternatively, the master controller 180 can include one or more of a number of features in addition to, or altered from, the features of the controller 104 described below. As described herein, communication with the master controller 180 can include communicating with one or more other components of the system 100 or another system (e.g., an inventory system, a labor scheduling system). In such a case, the master controller 180 can facilitate such communication.

The one or more sensor devices 160 can be any type of sensing device that measures one or more parameters. Examples of types of sensor devices 160 can include, but are not limited to, an infrared camera, a passive infrared sensor, a photocell, a microphone, a pressure sensor, a proximity sensor, a SONAR sensor, a LIDAR sensor, a seismic or vibration sensor, a camera, a global positioning system, a voltmeter, an ammeter, an ohmmeter, a VAR meter, and an air flow monitor. A parameter that can be measured by a sensor module 160 can include, but is not limited to, heat, current, voltage, resistance, VARs, vibration, air flow, gas levels, distance, and time. In certain example embodiments, the parameters measured by a sensor device 160 can be directly or indirectly associated with one or more pieces of electrical equipment 140.

In some cases, the parameter or parameters measured by a sensor device 160 can be used by the controller 104 to identify a problem that may exist with one or more pieces of electrical equipment 140 in the system 100. In such a case, the controller 104 can use the information provided by a sensor device 160 to evaluate the electrical equipment 140. If the controller 104 needs more information, the controller 104 can provide specific instructions to the sensor device 160, another sensor device 160, and/or a user 150 to collect further data (e.g., measurements of parameters), and subsequently provide that data to the controller 104 for further evaluation. This iterative process may continue until the controller 104 can determine whether the piece of electrical equipment 140 has a problem and, if so, notify the user 150 as to how specifically that problem can be fixed.

For example, a sensor module 160 can include an infrared camera controlled by a user 150. In such a case, the thermal camera captures a thermal image of one or more pieces of electrical equipment 140 (in this case, while the electrical equipment 140 is operating or at least being energized), and the user 150 sends the thermal image (either directly from the sensor module 160 or by some other means) to the controller 104. As another example, a sensor module 160 can include a voltmeter or ammeter to measure a component (e.g., voltage, current) of power flowing through or proximate to the electrical equipment 140. Such a measurement can be made automatically (if the sensor module 160 is permanently embedded in circuitry associated with the electrical equipment 140) or by a user 150.

If a sensor module 160 is able to communicate (e.g., with a user 150, with the controller 104), the sensor module 160 can use one or more of a number of communication protocols. A sensor module 160 can be part of, or separate from, the controller 104 and/or the user 150. In certain example embodiments, a sensor module 160 can include a battery or some other source of power that is used to provide power, at least in part, to some or all of the rest of the sensor module 160.

The electrical equipment 140 can include one or more electrical devices that are integrated with a larger electrical system. Each piece of electrical equipment 140 uses electricity to operate. Examples of electrical equipment 140 can include, but are not limited to, a busbar, an electrical cable, an electrical conductor, a motor, a protective relay, a terminal block, a circuit breaker, a switch, an indicating light, a fuse, a controller, a contactor, a variable frequency drive, an inductor, an inverter, and a transformer. In some cases, one or more sensor modules 160 can be integrated with a piece of electrical equipment 140.

The user 150, the master controller 180, the sensor modules 160, and/or the electrical equipment 140 can interact with the controller 104 using the application interface 126 in accordance with one or more example embodiments. Specifically, the application interface 126 of the controller 104 receives data (e.g., measurements of parameters, communications, instructions, updates to firmware) from and sends data (e.g., information, communications, instructions) to the user 150, the master controller 180, the sensor modules 160, and/or the electrical equipment 140. The user 150, the master controller 180, the sensor modules 160, and/or the electrical equipment 140 can include an interface to receive data from and send data to the controller 104 in certain example embodiments. Examples of such an interface can include, but are not limited to, a graphical user interface, a touchscreen, an application programming interface, a keyboard, a monitor, a mouse, a web service, a data protocol adapter, some other hardware and/or software, or any suitable combination thereof.

The controller 104, the user 150, the master controller 180, the sensor modules 160, and/or the electrical equipment 140 can use their own system or share a system in certain example embodiments. Such a system can be, or contain a form of, an Internet-based or an intranet-based computer system that is capable of communicating with various software. A computer system includes any type of computing device and/or communication device, including but not limited to the controller 104. Examples of such a system can include, but are not limited to, a desktop computer with Local Area Network (LAN), Wide Area Network (WAN), Internet or intranet access, a laptop computer with LAN, WAN, Internet or intranet access, a smart phone, a server, a server farm, an android device (or equivalent), a tablet, smartphones, and a personal digital assistant (PDA). Such a system can correspond to a computer system as described below with regard to FIG. 2.

Further, as discussed above, such a system can have corresponding software (e.g., user software, active configurator software, network manager software). The software can execute on the same or a separate device (e.g., a server, mainframe, desktop personal computer (PC), laptop, PDA, television, cable box, satellite box, kiosk, telephone, mobile phone, or other computing devices) and can be coupled by the communication network (e.g., Internet, Intranet, Extranet, LAN, WAN, or other network communication methods) and/or communication channels, with wire and/or wireless segments according to some example embodiments. The software of one system can be a part of, or operate separately but in conjunction with, the software of another system within the system 100.

The controller 104 can include an optional housing. In some cases, the housing can be designed to comply with any applicable standards so that the controller 104 can be located in a particular environment (e.g., a humid environment, a cold environment). The housing of the controller 104, when applicable, can be used to house one or more components of the controller 104. For example, the controller 104 (which in this case includes the control engine 106, the communication module 108, the timer 110, the energy metering module 111, the diagnostics module 159, the power module 112, the storage repository 130, the hardware processor 120, the memory 122, the transceiver 124, the application interface 126, and the optional security module 128) can be disposed in a cavity formed by a housing or integrated with a housing. In alternative embodiments, any one or more of these and/or other components of the controller 104 can be disposed on a housing and/or remotely from a housing.

The storage repository 130 can be a persistent storage device (or set of devices) that stores software and data used to assist the controller 104 in communicating with the user 150, the master controller 180, the sensor modules 160, and/or the electrical equipment 140 within the system 100. In one or more example embodiments, the storage repository 130 stores one or more protocols 132, algorithms 133, and stored data 134. The protocols 132 are any logic steps and/or methods followed by the control engine 106 based on certain conditions at a point in time. The protocols 132 can include any of a number of communication protocols that are used to send and/or receive data between the controller 104 and the user 150, the master controller 180, the sensor modules 160, and/or the electrical equipment 140. A protocol 132 can also include any of a number of processes for requesting and receiving information from, and for providing instructions to, the user 150 and/or a sensor device 160.

A protocol 132 can also be a method by which to implement one or more stages (e.g., planning, scheduling, purchasing, implementing) performed by the controller 104, in conjunction with one or more users 150, in association with repairing and/or replacing electrical equipment 140. One or more of the protocols 132 can be a time-synchronized protocol. Examples of such time-synchronized protocols can include, but are not limited to, a highway addressable remote transducer (HART) protocol, a wirelessHART protocol, and an International Society of Automation (ISA) 100 protocol. In this way, one or more of the protocols 132 can provide a layer of security to the data transferred within the system 100.

The algorithms 133 can be any formulas, mathematical models, and/or other similar operational tools that the control engine 106 of the controller 104 uses. An example of an algorithm 133 is identifying a permitted layout of selected equipment in a volume of space in light of existing equipment and systems, code and regulatory requirements, and cost. An algorithm 133 can be fixed or modified (e.g., by a user 150, by the control engine 106) over time. Modification of an algorithm 133 can be based on one or more of a number of factors, including but not limited to measurements made by a sensor device 160, an instruction from a user 150, and correction based on actual data.

Stored data 134 can be any data (e.g., processing speed) associated with the controller 104, any data associated with a sensor device 160, any measurements taken by a sensor device 160, threshold values, results of previously run or calculated algorithms 133, and/or any other suitable data. Such data can be any type of data, including but not limited to historical data, results of previously-run algorithms 133, prior calculations, forecasts, and real-time data (e.g., present measurements taken by one or more sensor modules 160). The stored data 134 can be associated with some measurement of time derived, for example, from the timer 110.

Examples of a storage repository 130 can include, but are not limited to, a database (or a number of databases), a file system, a hard drive, flash memory, some other form of solid state data storage, or any suitable combination thereof. The storage repository 130 can be located on multiple physical machines, each storing all or a portion of the protocols 132, the algorithms 133, and/or the stored data 134 according to some example embodiments. Each storage unit or device can be physically located in the same or in a different geographic location.

The storage repository 130 can be operatively connected to the control engine 106. In one or more example embodiments, the control engine 106 includes functionality to communicate with the user 150, the master controller 180, the sensor modules 160, and/or the electrical equipment 140. More specifically, the control engine 106 sends information to and/or receives information from the storage repository 130 in order to communicate with the user 150, the master controller 180, the sensor modules 160, and/or the electrical equipment 140. As discussed below, the storage repository 130 can also be operatively connected to the communication module 108 in certain example embodiments.

In certain example embodiments, the control engine 106 of the controller 104 controls the operation of one or more components (e.g., the communication module 108, the timer 110, the transceiver 124, the energy metering module 111) of the controller 104. For example, the control engine 106 can activate the communication module 108 when the communication module 108 is in "sleep" mode and when the communication module 108 is needed to send data received from another component (e.g., a sensor device 160, the user 150) in the system 100. As another example, the control engine 106 can acquire the current time using the timer 110. The timer 110 can enable the controller 104 to operate even when the controller 104 has no communication with the master controller 180.

The control engine 106 can be configured to perform a number of functions that help the controller 104 perform one or more functions. As discussed above, the control engine 106 can execute any of the protocols 132 and/or the algorithms 133, using stored data 134 stored in the storage repository 130 to perform one or more functions of a diagnostic evaluation process. For example, the control engine 106 can receive measurements (e.g., an infrared image) taken by a sensor module 160 (e.g., an infrared camera) of electrical equipment 140. The control engine 106 can send these measurements to the diagnostics module 159 to evaluate these measurements and determine whether there may be a problem with the electrical equipment 140. If the diagnostics module 159 determines that there may be a problem with the electrical equipment 140, but that more information is needed, the control engine 106 can send detailed instructions to the user 150 and/or one or more sensor devices 160 to take one or more other measurements of or related to the electrical equipment 140.

The control engine 106 can provide control, communication, and/or other similar signals to the user 150, the master controller 180, the sensor modules 160, and/or the electrical equipment 140. Similarly, the control engine 106 can receive control, communication, and/or other similar signals from the user 150, the master controller 180, the sensor modules 160, and/or the electrical equipment 140. The control engine 106 can control each sensor device 160 automatically (for example, based on one or more protocols 132 or algorithms 133 stored in the control engine 106) and/or based on control, communication, and/or other similar signals received from another component of the system 100 through a communication link 105. The control engine 106 may include a printed circuit board, upon which the hardware processor 120 and/or one or more discrete components of the controller 104 are positioned.

As stated above, in certain embodiments, the control engine 106 of the controller 104 can communicate with master controller 180 in furtherance of installing a system and/or equipment within a volume of space. For example, the control engine 106 can interact with the master controller 180, which interacts with an inventory management system to determine what equipment is currently in inventory and at what location. As another example, the control engine 106 can interact with the master controller 180, which interacts with a workforce scheduling system by scheduling a construction crew (e.g., electricians, mechanics, instrument and control technicians) to install or replace a piece of equipment in a volume of space. In this way, the controller 104 is capable of performing a number of functions beyond what could reasonably be considered a routine task.

In certain example embodiments, the control engine 106 can include an interface that enables the control engine 106 to communicate with one or more components of the system 100. For example, if sensor device 160 operates under IEC Standard 62386, then the sensor device 160 can have a serial communication interface that will transfer data (e.g., stored data 134) measured by the sensor device 160. In such a case, the control engine 106 can also include a serial interface to enable communication with the sensor device 160. Such an interface can operate in conjunction with, or independently of, the protocols 132 used to communicate between the controller 104 and the user 150, the master controller 180, the sensor devices 160, and the electrical equipment 140.

The control engine 106 (or other components of the controller 104) can also include one or more hardware components and/or software elements to perform its functions. Such components can include, but are not limited to, a universal asynchronous receiver/transmitter (UART), a serial peripheral interface (SPI), a direct-attached capacity (DAC) storage device, an analog-to-digital converter, an inter-integrated circuit ($I^2C$), and a pulse width modulator (PWM). In some cases, one or more additional modules can be included in a controller 104. Alternatively, the control engine 106 can perform additional functions in lieu of adding a module.

The diagnostics module 159 can communicate with the control engine 106. The diagnostics module 159 can interpret various data (e.g., thermal images, measurements, nameplate data of electrical equipment 140, maintenance and operational history of electrical equipment 140, algorithms 133, protocols 132) to determine the status or condition of electrical equipment 140. If this evaluation of the electrical equipment 140 by the diagnostics module 159 is inconclusive, the diagnostics module 159 can instruct the control engine 106 to have the user 150 and/or certain sensor modules 160 take certain measurements of the electrical equipment 140.

This iteration between the diagnostics module 159, the control engine 106, and the user 150/sensor modules 160 can be repeated multiple times until the diagnostics module 159 has identified one or more specific problems with the electrical equipment 140 and specific solutions for fixing the problems with the electrical equipment 140. These specific solutions are communicated by the diagnostics module 159 to the control engine 106, which then sends the specific solutions to one or more users 150 to implement.

In order to evaluate the measurements from the sensor devices 160, the diagnostics module 159 can also map the electrical system, of which the electrical equipment 140 is a part. For example, the diagnostics module 159 can generate a database (part of the stored data 134 in the storage repository 130) that is the equivalent of a single-line diagram of some or all of an electrical system. The database can include nameplate data of electrical equipment 140, size of the electrical equipment 140 (e.g., length of electrical cable, gauge of conductors of the electrical cable), location of the electrical equipment 140 (e.g., GPS coordinates), manufacturer of the electrical equipment 140, age of the electrical equipment 140, maintenance history of the electrical equipment 140, and/or any other suitable information about the electrical equipment 140. At least some of this information can be stored data 134.

In some cases, a user 150 can take measurements of certain pieces of electrical equipment 140 (e.g., the length of an electrical cable, the height of a breaker cabinet, the length of a cable tray). Such measurements can be taken using a tape measure, using a ruler, using calipers, interpretation of a picture, using a laser measurement device, and/or by any other means. A user 150 can also visually confirm information about the electrical equipment 140 that is stored in the storage repository 130. For example, a user 150 can visually confirm whether the conductor size and number of conductors in a particular electrical cable are correct and, if not, make the appropriate changes to accurately reflect the information about the electrical cable that are stored in the storage repository 130 as stored data 134.

The diagnostics module 159 can also have information related to calculating for one or more of any of a number of conditions, such as incident energy and arc flash. Every year, thousands of arc flash electrical explosions occur, often severely injuring or even killing electrical workers or other personnel (e.g., users 150). The example diagnostics module 159 can use various stored data 134 (e.g., nameplate information, measurements) to perform calculations that will identify potential arc flashes, notify a user 150 of the potential danger, and instruct a user 150 as to how to reduce or eliminate the risk of an arc flash occurring.

In this way, by maintaining a database, the diagnostics module 159 can make specific requests for further measurements to be taken by a user 150/sensor modules 160 to gather more information in assessing a problem with the electrical equipment 140 in the electrical system. Further, such a database can allow the diagnostics module 159 to make specific recommendations as to how to solve an identified problem with the electrical equipment 140. For example, the diagnostics module 159 can initiate an order to replace a filed piece of electrical equipment 140 (e.g., a motor) so that the identical electrical equipment 140 (e.g., same nameplate information) is used.

The diagnostic module 159 can also perform other tasks in relation to solving a problem with a piece of electrical equipment 140. For example, the diagnostic module 159 can provide, through the control engine 106, specific step-by-step instructions for solving a problem with a piece of electrical equipment 140. Alternatively, for more involved problems, the diagnostic module 159 can schedule maintenance with the appropriate employees, departments, and/or contractors to resolve a problem with a piece of electrical equipment 140.

The communication module 108 of the controller 104 determines and implements the communication protocol (e.g., from the protocols 132 of the storage repository 130) that is used when the control engine 106 communicates with (e.g., sends signals to, receives signals from) the user 150, the master controller 180, the sensor modules 160, and/or the electrical equipment 140. In some cases, the communication module 108 can interpret the communication protocol of a communication received by the controller 104 so that the control engine 106 can interpret the communication.

The communication module 108 can send and receive data between the master controller 180, the sensor modules 160, the electrical equipment 140, the user 150, and the controller 104. The communication module 108 can send and/or receive data in a given format that follows a particular protocol 132. The control engine 106 can interpret the data packet received from the communication module 108 using the protocol 132 information stored in the storage repository 130. The control engine 106 can also facilitate the data transfer between one or more sensor modules 160, the electrical equipment 140, the master controller 180, and/or a user 150 by converting the data into a format understood by the communication module 108.

The communication module 108 can send data (e.g., protocols 132, algorithms 133, stored data 134, operational information, instructions) directly to and/or retrieve data directly from the storage repository 130. Alternatively, the control engine 106 can facilitate the transfer of data between the communication module 108 and the storage repository 130. The communication module 108 can also provide encryption to data that is sent by the controller 104 and decryption to data that is received by the controller 104. The communication module 108 can also provide one or more of a number of other services with respect to data sent from and received by the controller 104. Such services can include, but are not limited to, data packet routing information and procedures to follow in the event of data interruption.

The timer 110 of the controller 104 can track clock time, intervals of time, an amount of time, and/or any other measure of time. The timer 110 can also count the number of occurrences of an event, whether with or without respect to time. Alternatively, the control engine 106 can perform the counting function. The timer 110 is able to track multiple time measurements concurrently. The timer 110 can track time periods based on an instruction received from the control engine 106, based on an instruction received from the user 150, based on an instruction programmed in the software for the controller 104, based on some other condition or from some other component, or from any combination thereof.

The timer 110 can be configured to track time when there is no power delivered to the controller 104 (e.g., the power module 112 malfunctions) using, for example, a super capacitor or a battery backup. In such a case, when there is a resumption of power delivery to the controller 104, the timer 110 can communicate any aspect of time to the controller 104. In such a case, the timer 110 can include one or more of a number of components (e.g., a super capacitor, an integrated circuit) to perform these functions.

The energy metering module 111 of the controller 104 is capable of monitoring various electrical values (e.g., voltage, current) at and within the controller 104. In this way, if a measured value falls outside an acceptable range, appropriate action can be taken to ensure that no adverse long-term effects are caused to the controller 104. The energy metering module 111 can include one or more of a number of components. Such components can include, but are not limited to, a resistor, a capacitor, a meter, a fuse, and a switch.

The power module 112 of the controller 104 provides power to one or more other components (e.g., timer 110, control engine 106) of the controller 104. The power module 112 can include one or more of a number of single or multiple discrete components (e.g., transistor, diode, resistor), and/or a microprocessor. The power module 112 may include a printed circuit board, upon which the microprocessor and/or one or more discrete components are positioned. In some cases, the power module 112 can include one or more components that allow the power module 112 to measure one or more elements of power (e.g., voltage, current) that is delivered to and/or sent from the power module 112, The power module 112 can receive power (for example, through an electrical cable) from a source (e.g., the power source) external to the controller 104 and generates power of a type (e.g., alternating current, direct current) and level (e.g., 12V, 24V, 120V) that can be used by the other components of the controller 104. The power module 112 can use a closed control loop to maintain a preconfigured voltage or current with a tight tolerance at the output. The power module 112 can also protect the rest of the electronics (e.g., hardware processor 120, transceiver 124) in the controller 104 from surges generated in the line.

In addition, or in the alternative, the power module 112 can be a source of power in itself to provide signals to the other components of the controller 104. For example, the power module 112 can be a battery. As another example, the power module 112 can be a localized photovoltaic power system. The power module 112 can also have sufficient isolation in the associated components of the power module 112 (e.g., transformers, opto-couplers, current and voltage limiting devices) so that the power module 112 is certified to provide power to an intrinsically safe circuit.

In certain example embodiments, the power module 112 of the controller 104 can also provide power and/or control signals, directly or indirectly, to one or more of the sensor modules 160. In such a case, the control engine 106 can direct the power generated by the power module 112 to the sensor modules 160. In this way, power can be conserved by sending power to the sensor modules 160 when those devices need power, as determined by the control engine 106.

The hardware processor 120 of the controller 104 executes software, algorithms, and firmware in accordance with one or more example embodiments. Specifically, the hardware processor 120 can execute software on the control engine 106 or any other portion of the controller 104, as well as software used by the user 150, the master controller 180, the sensor modules 160, and/or the electrical equipment 140. The hardware processor 120 can be an integrated circuit, a central processing unit, a multi-core processing chip, SoC, a multi-chip module including multiple multi-core processing chips, or other hardware processor in one or more example embodiments. The hardware processor 120 is known by other names, including but not limited to a computer processor, a microprocessor, and a multi-core processor.

In one or more example embodiments, the hardware processor 120 executes software instructions stored in memory 122. The memory 122 includes one or more cache memories, main memory, and/or any other suitable type of memory. The memory 122 can include volatile and/or non-volatile memory. The memory 122 is discretely located within the controller 104 relative to the hardware processor 120 according to some example embodiments. In certain configurations, the memory 122 can be integrated with the hardware processor 120.

In certain example embodiments, the controller 104 does not include a hardware processor 120. In such a case, the controller 104 can include, as an example, one or more field programmable gate arrays (FPGA), insulated-gate bipolar transistors (IGBTs), and integrated circuits (ICs). Using FPGAs, IGBTs, ICs, and/or other similar devices known in the art allows the controller 104 (or portions thereof) to be programmable and function according to certain logic rules and thresholds without the use of a hardware processor. Alternatively, FPGAs, IGBTs, ICs, and/or similar devices can be used in conjunction with one or more hardware processors 120.

The transceiver 124 of the controller 104 can send and/or receive control and/or communication signals. Specifically, the transceiver 124 can be used to transfer data between the controller 104 and the user 150, the master controller 180, the sensor modules 160, and/or the electrical equipment 140. The transceiver 124 can use wired and/or wireless technology. The transceiver 124 can be configured in such a way that the control and/or communication signals sent and/or received by the transceiver 124 can be received and/or sent by another transceiver that is part of the user 150, the master controller 180, the sensor modules 160, and/or the electrical equipment 140. The transceiver 124 can use any of a number of signal types, including but not limited to radio frequency signals.

When the transceiver 124 uses wireless technology, any type of wireless technology can be used by the transceiver 124 in sending and receiving signals. Such wireless technology can include, but is not limited to, Wi-Fi, visible light communication (VLC), cellular networking, UART, SPI, I2C, 802.15.4 wireless, ZigBee, 4G cellular wireless, Bluetooth, and Bluetooth Low Energy (BLE). The transceiver 124 can use one or more of any number of suitable communication protocols (e.g., ISA100, HART) when sending and/or receiving signals. Such communication protocols can be stored in the protocols 132 of the storage repository 130. Further, any transceiver information for the user 150, the master controller 180, the sensor modules 160, and/or the electrical equipment 140 can be part of the stored data 134 (or similar areas) of the storage repository 130.

Optionally, in one or more example embodiments, the security module 128 secures interactions between the controller 104, the user 150, the master controller 180, the sensor modules 160, and/or the electrical equipment 140. More specifically, the security module 128 authenticates communication from software based on security keys verifying the identity of the source of the communication. For example, user software may be associated with a security key enabling the software of the user 150 to interact with the controller 104. Further, the security module 128 can restrict receipt of information, requests for information, and/or access to information in some example embodiments.

Figure 2:
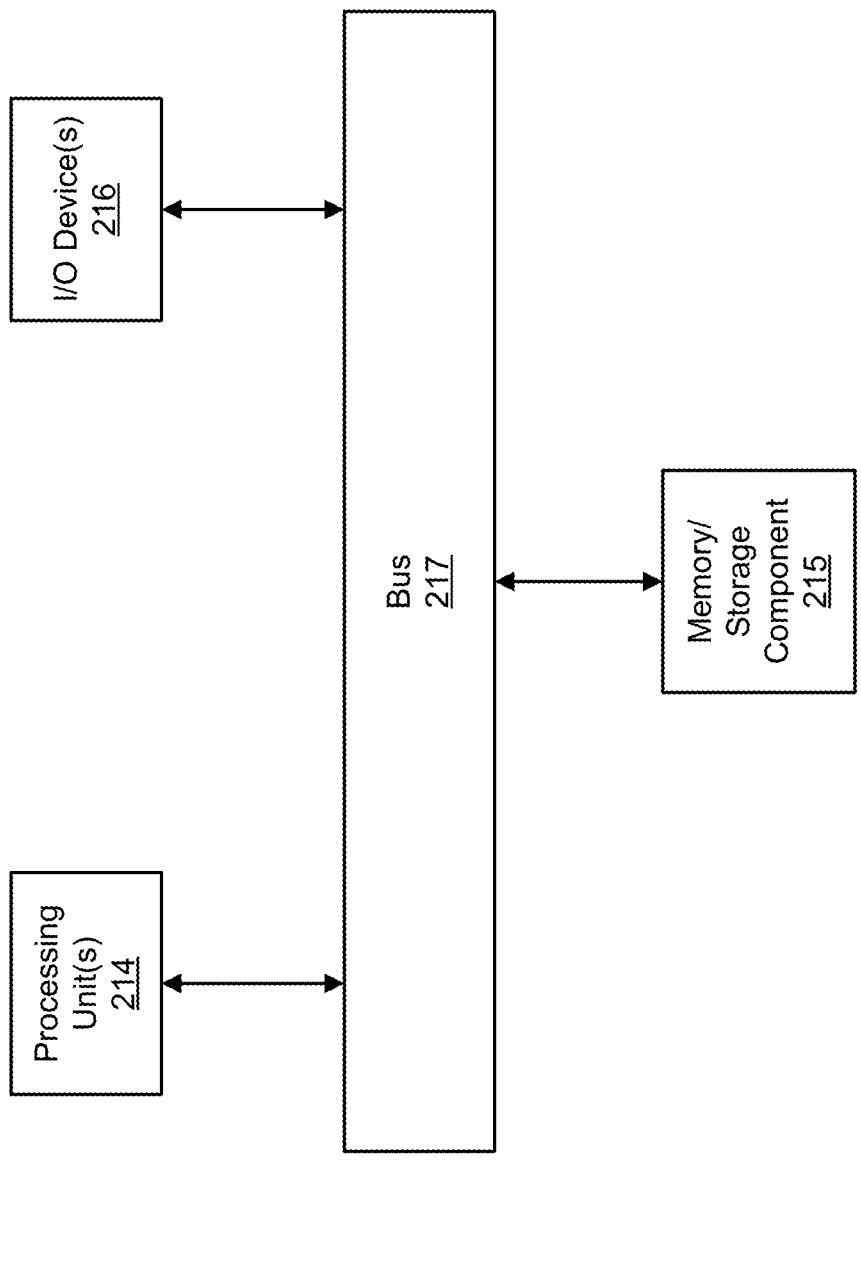
FIG. 2 shows a computing device in accordance with one or more example embodiments.

FIG. 2 illustrates one embodiment of a computing device 218 that implements one or more of the various techniques described herein, and which is representative, in whole or in part, of the elements described herein pursuant to certain exemplary embodiments. Computing device 218 is one example of a computing device and is not intended to suggest any limitation as to scope of use or functionality of the computing device and/or its possible architectures. Neither should computing device 218 be interpreted as having any dependency or requirement relating to any one or combination of components illustrated in the example computing device 218.

Computing device 218 includes one or more processors or processing units 214, one or more memory/storage components 215, one or more input/output (I/O) devices 216, and a bus 217 that allows the various components and devices to communicate with one another. Bus 217 represents one or more of any of several types of bus structures, including a memory bus or memory controller, a peripheral bus, an accelerated graphics port, and a processor or local bus using any of a variety of bus architectures. Bus 217 includes wired and/or wireless buses.

Memory/storage component 215 represents one or more computer storage media. Memory/storage component 215 includes volatile media (such as random access memory (RAM)) and/or nonvolatile media (such as read only memory (ROM), flash memory, optical disks, magnetic disks, and so forth). Memory/storage component 215 includes fixed media (e.g., RAM, ROM, a fixed hard drive, etc.) as well as removable media (e.g., a Flash memory drive, a removable hard drive, an optical disk, and so forth).

One or more I/O devices 216 allow a customer, utility, or other user to enter commands and information to computing device 218, and also allow information to be presented to the customer, utility, or other user and/or other components or devices. Examples of input devices include, but are not limited to, a keyboard, a cursor control device (e.g., a mouse), a microphone, a touchscreen, and a scanner. Examples of output devices include, but are not limited to, a display device (e.g., a monitor or projector), speakers, outputs to a lighting network (e.g., DMX card), a printer, and a network card.

Various techniques are described herein in the general context of software or program modules. Generally, software includes routines, programs, objects, components, data structures, and so forth that perform particular tasks or implement particular abstract data types. An implementation of these modules and techniques are stored on or transmitted across some form of computer readable media. Computer readable media is any available non-transitory medium or non-transitory media that is accessible by a computing device. By way of example, and not limitation, computer readable media includes "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which is used to store the desired information and which is accessible by a computer.

The computer device 218 is connected to a network (not shown) (e.g., a local area network (LAN), a wide area network (WAN) such as the Internet, cloud, or any other similar type of network) via a network interface connection (not shown) according to some exemplary embodiments. Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means take other forms, now known or later developed, in other exemplary embodiments. Generally speaking, the computer system 218 includes at least the minimal processing, input, and/or output means necessary to practice one or more embodiments.

Further, those skilled in the art will appreciate that one or more elements of the aforementioned computer device 218 is located at a remote location and connected to the other elements over a network in certain exemplary embodiments. Further, one or more embodiments is implemented on a distributed system having one or more nodes, where each portion of the implementation (e.g., control engine 106) is located on a different node within the distributed system. In one or more embodiments, the node corresponds to a computer system. Alternatively, the node corresponds to a processor with associated physical memory in some exemplary embodiments. The node alternatively corresponds to a processor with shared memory and/or resources in some exemplary embodiments.

Figure 3:
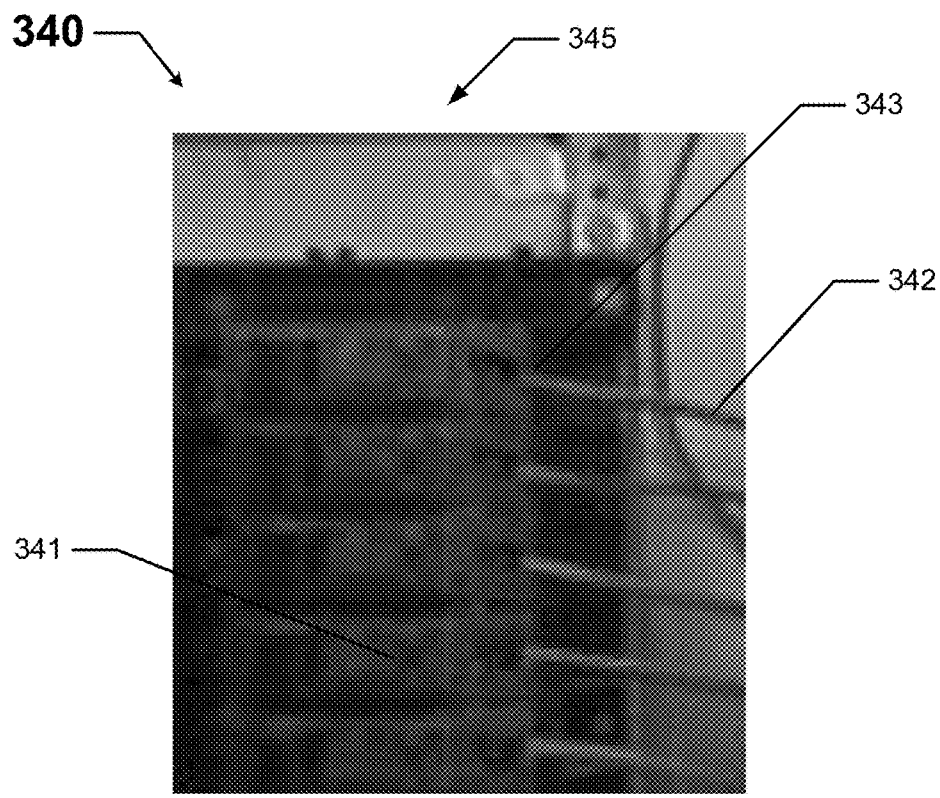
FIG. 3 shows electrical equipment that can be diagnosed using certain example embodiments.

FIG. 3 shows electrical equipment 340 that can be diagnosed using certain example embodiments. Referring to FIGS. 1-3, the electrical equipment 340 of FIG. 3 includes a number of circuit breakers 341 set side-by-side into a panel 345. Also disposed within the panel 345 are a number of electrical conductors 342 (also part of the electrical equipment 340), where each electrical conductor 342 is terminated at one end 343 of a circuit breaker 341.

Figure 4:
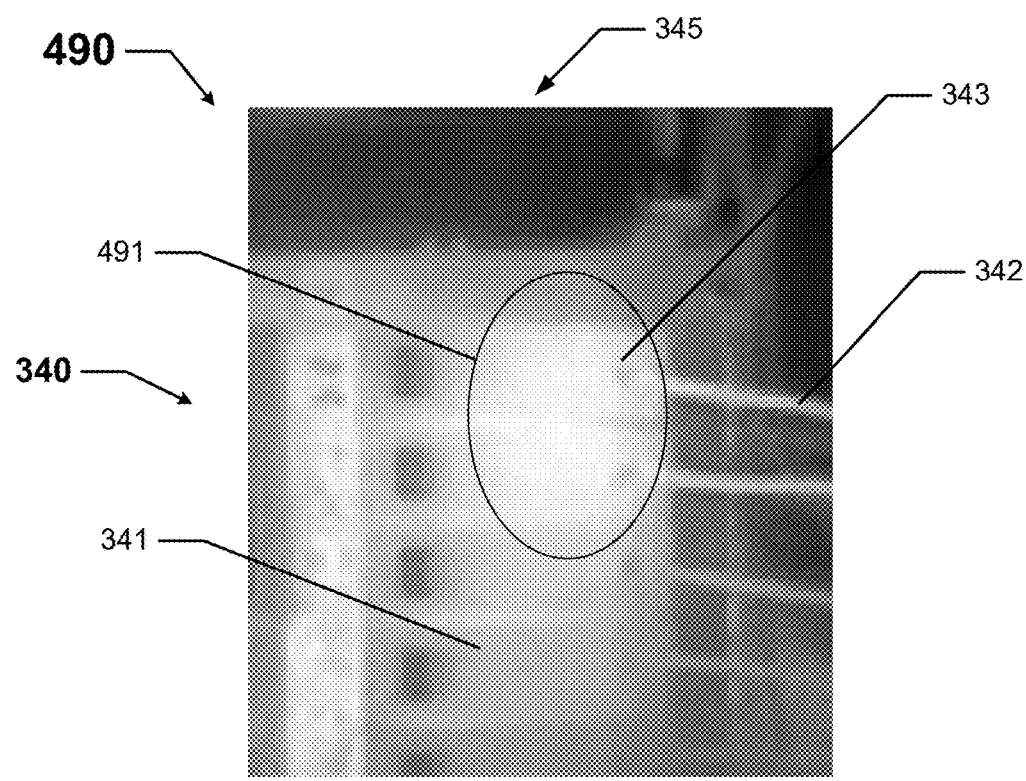
FIG. 4 shows a measurement in the form of an infrared image of the electrical equipment of FIG. 3.

FIG. 4 shows a measurement 490 in the form of an infrared image of the electrical equipment 340 of FIG. 3. Referring to FIGS. 1-4, the measurement 490 shows a hotspot 491 centered on the end 343 of the top two circuit breakers 341, close to where the electrical conductors 342 terminate. The user 150 can use a sensor device 160 (in this case, an infrared camera) to take the measurement 490. The measurement 490 can be sent to the controller 104 by the user 150 or directly from the sensor device 160.

Upon receiving the measurement 490, the controller 104 (and, more specifically, the control engine 106 and the diagnostic module 159) evaluates the measurement to determine if the hotspot 491 poses a problem. For example, the diagnostic module 159 can measure the size of the hot spot in making an evaluation. As another example, the diagnostic module 159 can measure the intensity of the hot spot. As yet another example, the diagnostic module 159 can determine the differential of temperatures in the image. As still another example, the diagnostic module 159 can measure the rate of change of temperatures across images of the electrical equipment over time.

In any case, generally speaking, the diagnostic module 159 is "deep learning", meaning that the diagnostic module 159 uses various learning algorithms to constantly improve the accuracy of its determinations, whether in interpreting an infrared image or for any other aspect of identifying a problem with electrical equipment 140 and prescribing specific steps to resolve the problem. The diagnostic module 159 can access information stored as stored data 134, protocols 132, and/or algorithms 133 to determine the temperature of the hotspot 491, the temperatures of the measurement 490 outside of the hotspot 491, and the identification (including the location and particular devices) of the electrical equipment 340.

If the diagnostic module 159 of the controller 104 needs more information in order to determine if the hotspot 491 poses a problem, then the diagnostic module 159 can request, through the control engine 106 of the controller 104, for additional specific measurements to be taken. For example, the diagnostic module 159 can request (e.g., to a user 150, to a sensor device 160) that the phase currents and voltages associated with the circuit breakers 341 within the hotspot 490 be measured. In such a case, these measurements can be made by the sensor devices 160 (in this case, a voltmeter and an ammeter), with or without the assistance of a user 150. These measurements are subsequently sent to the controller 104 by the sensor devices 160 or the user 150.

As an example, these additional measurements can be as follows: Phase A current=11 A, phase B current=0 A, phase C current=0 A, phase A voltage drop=70 mV, phase B voltage drop=0 mV, and phase C voltage drop=0 mV. In such a case, by using these voltage and current measurements in conjunction with the measurement 490 of FIG. 4, the diagnostic module 159 can determine that, while there is excessive heat showing across the top two circuit breakers 341 in FIGS. 3 and 4, the temperatures at those circuit breakers 341 do not exceed the Industry Best Practices Standard, and similarly the measured voltage drop of 70 mV is less than the maximum threshold value of 100 mV drop.

As a result, the circuit breakers 341 are not overloaded, but that the situation should be monitored. In such a case, the control engine 106 can access a workforce scheduling system to schedule the user 150 to take another measurement (like measurement 490) of the electrical equipment 340 in 7 days. These conclusions can be communicated by the control engine 106 to a user 150 and/or the master controller 180 in one or more of any of a number of formats (e.g., email, printable report, text message, alarm). The diagnostic module 159 may also instruct, through the control engine 106, the user 150 to tighten the connection between the electrical conductors 342 and the top two circuit breakers 341, and then take another measurement 490 with the sensor device 160 (infrared camera).

As another example, these additional measurements can be as follows: Phase A current=14.5 A, phase B current=0 A, phase C current=0 A, phase A voltage drop=110 mV, phase B voltage drop=0 mV, and phase C voltage drop=0 mV. In such a case, by using these voltage and current measurements in conjunction with the measurement 490 of FIG. 4, the diagnostic module 159 can determine that the top two circuit breakers 341 must be replaced as soon as possible. In such a case, the control engine 106 can check inventory to determine whether two circuit breakers of the same configuration (size, rating) are in stock, order the replacement circuit breakers if they are not in stock, determine when the downstream electrical equipment 140 can be put out of service relative to the availability of the replacement circuit breakers, and schedule a user 150 (e.g., an electrician) to perform the work coinciding with the timing of the outage windows and replacement circuit breaker availability.

Figure 5:
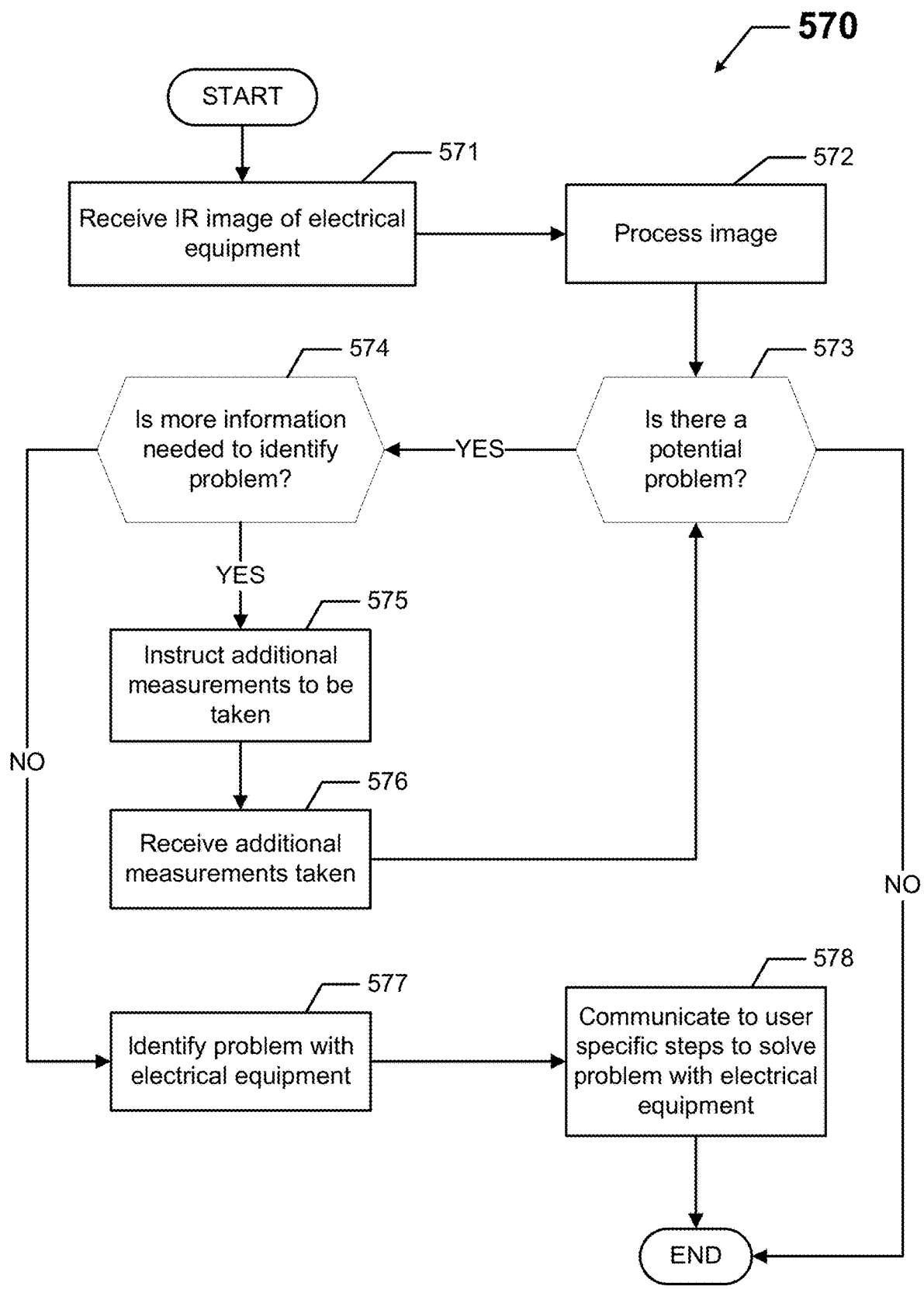
FIG. 5 shows a flow diagram of a method for diagnosing electrical equipment using an electrical equipment diagnostic system in accordance with certain example embodiments.

FIG. 5 shows an example method performed using an example electrical equipment diagnostic system (e.g., electrical equipment diagnostic system 100). While the various steps in this flowchart are presented sequentially, one of ordinary skill will appreciate that some or all of the steps may be executed in different orders, may be combined or omitted, and some or all of the steps may be executed in parallel. Further, in one or more of the example embodiments, one or more of the steps shown in this example method may be omitted, repeated, and/or performed in a different order.

In addition, a person of ordinary skill in the art will appreciate that additional steps not shown in FIG. 5 may be included in performing this method. Accordingly, the specific arrangement of steps should not be construed as limiting the scope. Further, a particular computing device, such as the computing device discussed above with respect to FIG. 2, can be used to perform one or more of the steps for the methods shown in FIG. 5 in certain example embodiments. The method discussed in FIG. 5 is not exclusive, meaning that the diagnosis of other electrical equipment based on other measurements made by sensor devices is possible using example embodiments.

The method shown in FIG. 5 is merely an example that can be performed by using an example system described herein. In other words, example electrical equipment diagnostic systems can perform other functions in addition to and/or aside from those shown in FIG. 5. Referring to FIGS. 1-5, FIG. 5 shows a flow diagram of a method 570 for diagnosing electrical equipment (e.g., electrical equipment 140) using an electrical equipment diagnostic system (e.g., electrical equipment diagnostic system 100) in accordance with certain example embodiments.

In FIG. 5, the method 570 begins at the START step and proceeds to step 571, where an infrared (IR) image 490 of electrical equipment 140 is received. The IR image 490 can be received by the controller 104. The IR image 490 can be received from a user 150 or a sensor device 160 (in this case, an infrared camera). In some cases, more generally, one or more measurements (of which the IR image 490 can be included) of the electrical equipment 140 can be received. The IR image 490 can be captured when the electrical equipment is in service.

In step 572, the IR image 490 is processed. The controller 104 (and, more specifically, the diagnostic module 159 of the controller 104) can process the IR image 490. The IR image 490 can be processed using one or more algorithms 133, one or more protocols 132, and/or stored data 134. Processing the IR image 490 can include identifying the specific electrical equipment 140 captured in the image, identifying the temperatures at each point in the IR image 490, and correlating the different temperatures with the specific electrical equipment 140. Processing the IR image 490 can also include comparing the various temperatures with threshold temperature values (part of the stored data 134) for the various electrical equipment 140.

In step 573, a determination is made as to whether there may be a problem with some or all of the electrical equipment 140. The determination of whether there may be a problem with some or all of the electrical equipment 140 can be made by the diagnostic module 159 of the controller 104. The determination can be based on one or more algorithms 133 and/or one or more protocols 132. If there may be a problem with some or all of the electrical equipment 140, the process proceeds to step 574. If there no problem with the electrical equipment 140, the process proceeds to the END step.

In step 574, a determination is made as to whether more information is needed to identify the problem with some or all of the electrical equipment 140. The determination of whether more information is needed to identify the problem with some or all of the electrical equipment 140 can be made by the diagnostic module 159 of the controller 104. The determination can be based on one or more algorithms 133 and/or one or more protocols 132. For example, if some of the temperatures in the IR image 490 are showing borderline high, the diagnostic module 159 may determine that some particular current and voltage readings are needed to identify the root cause of the high temperatures. If more information is needed to identify the problem with some or all of the electrical equipment 140, then the process proceeds to step 575. If more information is not needed to identify the problem with some or all of the electrical equipment 140, then the process proceeds to step 577.

In step 575, additional measurements are instructed to be taken. The instructions for the additional measurements can be made by the controller 104. The instructions for the additional measurements can be received by a user 150 and/or one or more sensor devices 160 (e.g., a voltmeter, an ammeter). The instruction for additional measurements can be specific as particular measurements taken at particular location(s) on the electrical equipment 140. In step 576, the additional measurements are received. The additional measurements can be received by the controller 104. The additional measurements can be received from a user 150 and/or one or more sensor devices 160. When step 576 is complete, the process reverts to step 573. The additional measurements can be taken when the electrical equipment is in service.

In step 577, one or more problems with the electrical equipment 140 are identified. Each problem with the electrical equipment 140 can be identified by the diagnostic module 159 of the controller 104. Each problem can be very specific (e.g., blown fuse, loose terminal connection, failed circuit breaker) to a particular piece of electrical equipment 140.

In step 578, specific steps to solve the problem(s) with the electrical equipment 140 are communicated to one or more users 150. A user 150 in this case can be an employee (e.g., an electrician), an inventory management system, a contractor, a labor scheduling system, a supplier, or any other party that could be involved in repair and/or replacement of the electrical equipment 140. When step 578 is complete, the process proceeds to the END step.

The controller 104 can also be involved in the process when the problem with the electrical equipment 140 is fixed. For example, the results of any testing of replacement electrical equipment 140 can be stored as stored data 134. In all cases throughout the method 570 of FIG. 5, the particular user 150 and/or sensor device 160 used in a step can be stored by the control engine 106 as stored data 134 and associated with the data for that step in the method 570. The method 570 of FIG. 5 can be done in real time, so that the user 150 taking the measurements can receive the specific instructions on how to fix the problem with the electrical equipment 140 within seconds from when the measurements are taken and sent to the controller 104.

Example embodiments provide a number of benefits. Examples of such benefits include, but are not limited to, reduced downtime of equipment, lower maintenance costs, avoidance of catastrophic failure, avoidance of injury to personnel, reduction in lost-time accidents, reduce the risk of an arc flash and other dangerous electrical conditions, prognosis of equipment failure, improved maintenance planning, specific locations where maintenance is required, improved efficiency of one or more devices and/or other portions of an example system, extended useful life of one or more components of an example system, and reduced cost of labor and materials. Example embodiments lead to specific assessments of actions needed to resolve a current or evolving problem with electrical equipment in real-time when measurements are taken by a user. Further, example embodiments are used to evaluate electrical equipment while the electrical equipment is in service, thereby allowing a diagnostic assessment to be performed at any time.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. An electrical equipment diagnostic system, comprising:
an electrical equipment;
a first sensor device that takes a first measurement of a first parameter of the electrical equipment while the electrical equipment is operating, wherein the first sensor device comprises an infrared camera; and
a controller communicably coupled to the first sensor device, wherein the controller comprises a storage repository, wherein the storage repository comprises at least one threshold value and at least one first algorithm, wherein the controller:
receives the first measurement from the first sensor device;
processes the at least one first algorithm using the first measurement;

instructs the user to take at least one second measurement proximate to the electrical equipment;

receives the at least one second measurement taken by the user;

processes at least one second algorithm using the at least one second measurement identifies a problem as a result of processing the at least one first algorithm and the at least one second algorithm;

identifies that the electrical equipment is affected by the problem;

generates, based on identifying the electrical equipment and the problem, at least one instruction that resolves the problem affecting the electrical equipment; and sends the at least one instruction to a user for the user to execute to correct the problem with the electrical equipment.

2. The system of claim 1, wherein the at least one second measurement is measured by at least one second sensor device, wherein the at least one second sensor device is communicably coupled to the controller.

3. The system of claim 1, wherein the controller, prior to identifying the problem and after processing the at least one second algorithm using the second measurement:

instructs the user to take at least one third measurement proximate to the electrical equipment;

receives the at least one third measurement taken by the user; and processes at least one third algorithm using the at least one third measurement, wherein the controller identifies the problem further based on results of the at least one third algorithm.

4. The system of claim 1, wherein the electrical equipment is among an integrated electrical system comprising a plurality of electrical components, wherein details of the plurality of electrical components of the integrated electrical system are used to generate the at least one instruction.

5. The system of claim 1, wherein the first measurement, identification of the electrical equipment, and the at least one instruction are stored and used in future evaluations of the electrical equipment.

6. The system of claim 1, wherein the user is part of a user system communicably coupled to the controller.

7. The system of claim 1, wherein the first sensor device is incorporated into the electrical equipment.

8. A method for diagnosing electrical equipment within a system, the method comprising:

receiving, at a diagnostic module, a first measurement from a first sensor device, wherein the first measurement measures a first parameter associated with the electrical equipment while the electrical equipment is in service, wherein the first sensor device comprises an infrared camera;

evaluating, by the diagnostic module, the first measurement;

determining, after the diagnostic module evaluates the first measurement, that additional information is needed to identify the problem with the electrical equipment;

sending, from the diagnostic module, a detailed request for additional measurements;

receiving, at the diagnostic module, the additional measurements;

determining, based on the diagnostic module evaluating the first measurement and the additional measurements, that there is a problem;

identifying, by the diagnostic module, the electrical equipment affected by the problem;

determining, by the diagnostic module based on identifying the electrical equipment and the problem, at least one instruction to solve the problem affecting the electrical equipment; and sending, from the diagnostic module, the at least one instruction to a user for the user to execute to resolve the problem.

9. The method of claim 8, wherein the first measurement comprises an infrared image of the electrical equipment.

10. The method of claim 8, wherein the detailed request for the additional measurements is sent to a user.

11. The method of claim 8, wherein the additional information is measured by a second sensor device.

12. The method of claim 8, wherein determining the at least one instruction to resolve the problem with the electrical equipment comprises ordering a replacement for the electrical equipment.

13. The method of claim 8, wherein determining the at least one instruction to resolve the problem with the electrical equipment comprises scheduling labor to replace the electrical equipment.

14. The method of claim 8, wherein the at least one instruction to resolve the problem with the electrical equipment is sent to the user in real time.

15. The method of claim 8, further comprising:

generating a database of an electrical system, wherein the electrical equipment is interconnected with the electrical system, wherein the database is translatable to a detailed single-line diagram of the electrical system.

16. A controller of an electrical equipment diagnostic system, comprising:

a control engine configured to receive a first measurement of electrical equipment from a sensor device, wherein the sensor device comprises an infrared camera, wherein the first measurement is taken while the electrical equipment is in service; and a diagnostic module communicably coupled to the control engine, wherein the diagnostic module is configured to:

process at least one algorithm using the first measurement;

determine, after processing the at least one algorithm, that at least one second measurement is needed to identify the problem;

send to the control engine specific instructions to obtain the at least one second measurement, wherein the control engine is configured to send the specific instructions to a user;

receive the at least one second measurement from the control engine, wherein the control engine is configured to receive the at least one second measurement from the user; and assess the at least one second measurement;

identify a problem as a result of processing the at least one algorithm and assessing the at least one second measurement;

identify the electrical equipment affected by the problem;

generate, based on identifying the electrical equipment and the problem, at least one instruction that resolves the problem affecting the electrical equipment; and send the at least one instruction so that a recipient, executing the at least one instruction, corrects the problem with the electrical equipment.

\* \* \* \* \*